United States Patent
Sun et al.

(10) Patent No.: US 11,856,875 B2
(45) Date of Patent: Dec. 26, 2023

(54) MEMORY DEVICES AND METHODS FOR FABRICATING MEMORY DEVICES

(71) Applicant: GLOBALFOUNDRIES Singapore Pte. Ltd., Singapore (SG)

(72) Inventors: Jianxun Sun, Singapore (SG); Juan Boon Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 414 days.

(21) Appl. No.: 17/134,572

(22) Filed: Dec. 28, 2020

(65) Prior Publication Data

US 2022/0209108 A1    Jun. 30, 2022

(51) Int. Cl.
*H01L 45/00* (2006.01)
*H10N 70/00* (2023.01)
*H10B 63/00* (2023.01)
*H10N 70/20* (2023.01)

(52) U.S. Cl.
CPC .......... *H10N 70/823* (2023.02); *H10B 63/80* (2023.02); *H10N 70/063* (2023.02); *H10N 70/841* (2023.02); *H10N 70/24* (2023.02); *H10N 70/883* (2023.02); *H10N 70/8833* (2023.02)

(58) Field of Classification Search
CPC .......... H10N 70/823; H10N 70/011
See application file for complete search history.

(56) References Cited

U.S. PATENT DOCUMENTS 9,564,587 B1 * 2/2017 Jo ........................ H10N 70/011

OTHER PUBLICATIONS

Hayakawa et al., "Highly reliable TaOx ReRAM with centralized filament for 28-nm embedded application", 2015 Symposium on VLSI Technology, 2015, 2 pages.
Lin et al., "Retention Model of TaO/HfOx and TaO/AlOx RRAM with Self-Rectifying Switch Characteristics", Nanoscale Research Letters, 2017, 6 pages.
Chen et al., "Scaled X-bar TiN/HfO2/TiN RRAM cells processed with optimized plasma enhanced atomic layer deposition (PEALD) for TiN electrode", Microelectronic Engineering, 2013, pp. 92-96, Elsevier B.V.

* cited by examiner

*Primary Examiner* — Mark V Prenty
(74) *Attorney, Agent, or Firm* — VIERING JENTSCHURA & PARTNER MBB

(57) ABSTRACT

A memory device may be provided. The memory device may include a first electrode including a first side surface and a second side surface opposite to the first side surface; a passivation layer arranged laterally alongside the first side surface of the first electrode; a switching layer arranged laterally alongside the passivation layer; and a second electrode arranged along the switching layer.

20 Claims, 6 Drawing Sheets

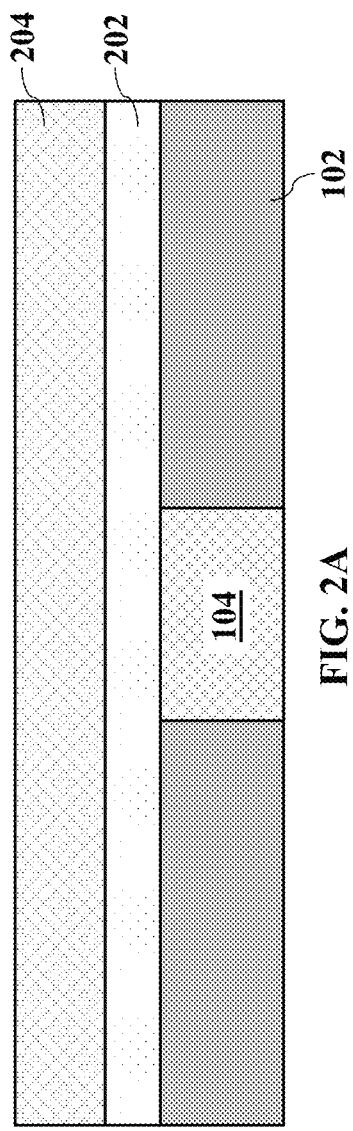
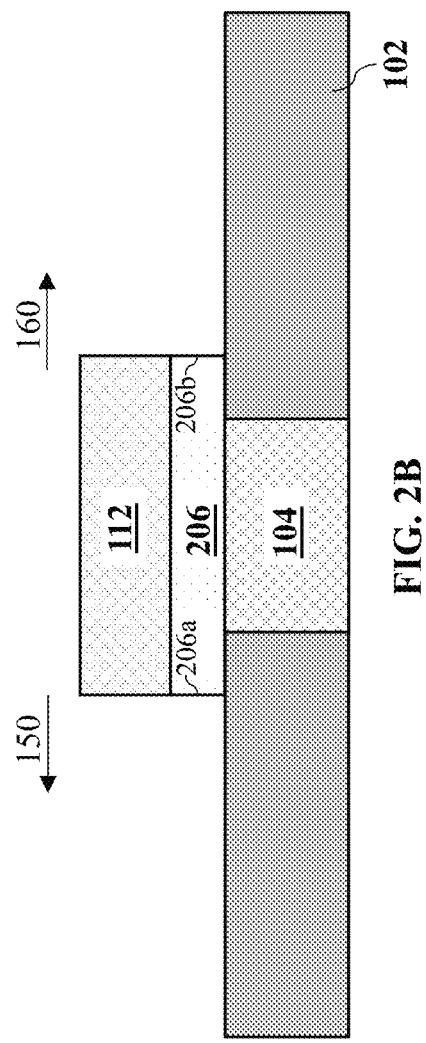
FIG. 2A
FIG. 2B

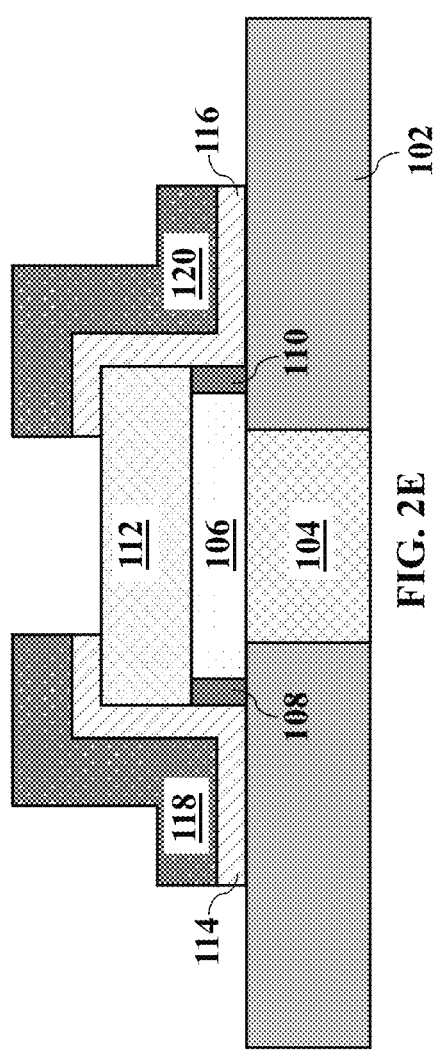
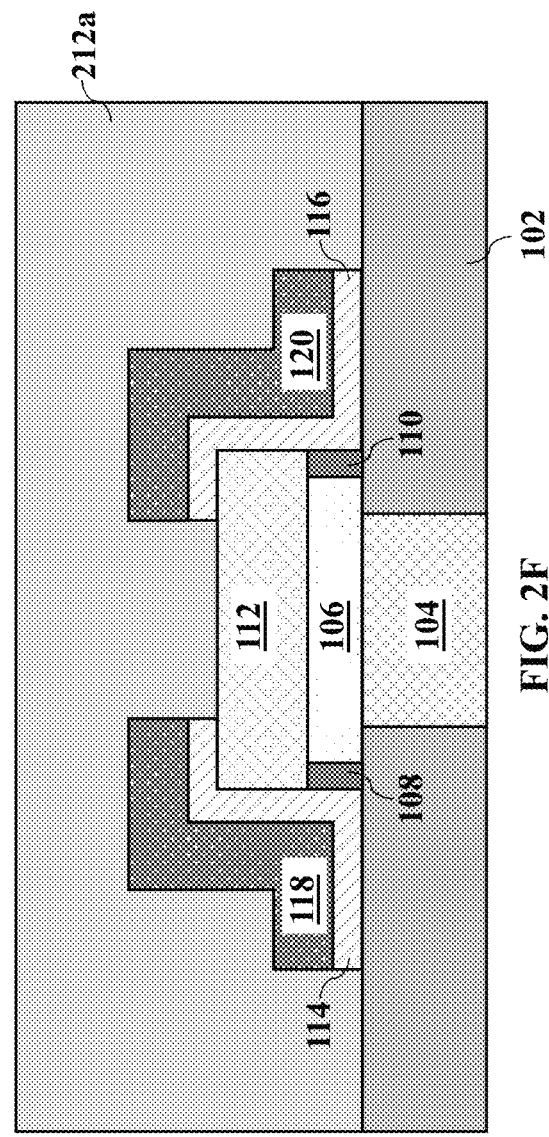

MEMORY DEVICES AND METHODS FOR FABRICATING MEMORY DEVICES

TECHNICAL FIELD

The present disclosure relates generally to memory devices and methods for fabricating the memory devices.

BACKGROUND

Non-volatile memory devices are often used in consumer electronic products such as smart phones and tablets. One type of non-volatile memory device is the resistive random access memory (RRAM) device. A RRAM device typically uses a switching layer such as a dielectric layer sandwiched between two electrodes. The switching layer is normally insulating. However, upon application of a sufficiently high potential difference between the electrodes, conductive filaments may be formed within the switching layer. The switching layer thus becomes conductive. The switching layer can be made insulating again by applying a sufficiently low voltage difference between the electrodes to break the conductive filaments. A typical RRAM device can switch between states based on the resistance of the switching layer. When the switching layer is insulating, the switching layer has a high resistance, and the RRAM device may be referred to as being in a high resistance state (HRS). When the switching layer is conductive, the switching layer has a low resistance and the RRAM device may be referred to as being in a low resistance state (LRS).

When fabricating a RRAM device, the switching material of the switching layer may react with the electrode material of the electrode(s). Defects may thus be formed at the interface(s) between the switching layer and one or both of the electrodes. For example, the switching material may include oxide and the electrode material may absorb oxygen atoms from the switching material, forming oxygen vacancies at the interface between the materials. This can cause unstable switching of the RRAM device. As a result, the resistance of the RRAM device (especially when the RRAM device is in the HRS) varies greatly over different switching cycles. This causes high device-to-device variability and cycle-to-cycle variability.

To reduce the amount of defects at the interface(s) between the switching layer and the electrodes in a RRAM device, an inert electrode material (for example, platinum (Pt), iridium (Ir) or ruthenium (Ru)) may be used to form the electrodes. Such an inert electrode material may react less with the switching material and thus, fewer defects may be formed. However, such an inert electrode material is often costly and difficult to etch.

SUMMARY

According to various non-limiting embodiments, there may be provided a memory device including a first electrode including a first side surface and a second side surface opposite to the first side surface; a passivation layer arranged laterally alongside the first side surface of the first electrode; a switching layer arranged laterally alongside the passivation layer; and a second electrode arranged along the switching layer.

According to various non-limiting embodiments, there may be provided a method for fabricating a memory device including: forming a first electrode including a first side surface and a second side surface opposite to the first side surface; forming a passivation layer laterally alongside the first side surface of the first electrode; forming a switching layer laterally alongside the passivation layer; and forming a second electrode along the switching layer.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 2A to 2G show simplified cross-sectional views illustrating a method for fabricating the memory device of FIG. 1 according to various non-limiting embodiments.

DETAILED DESCRIPTION

Figure 1:
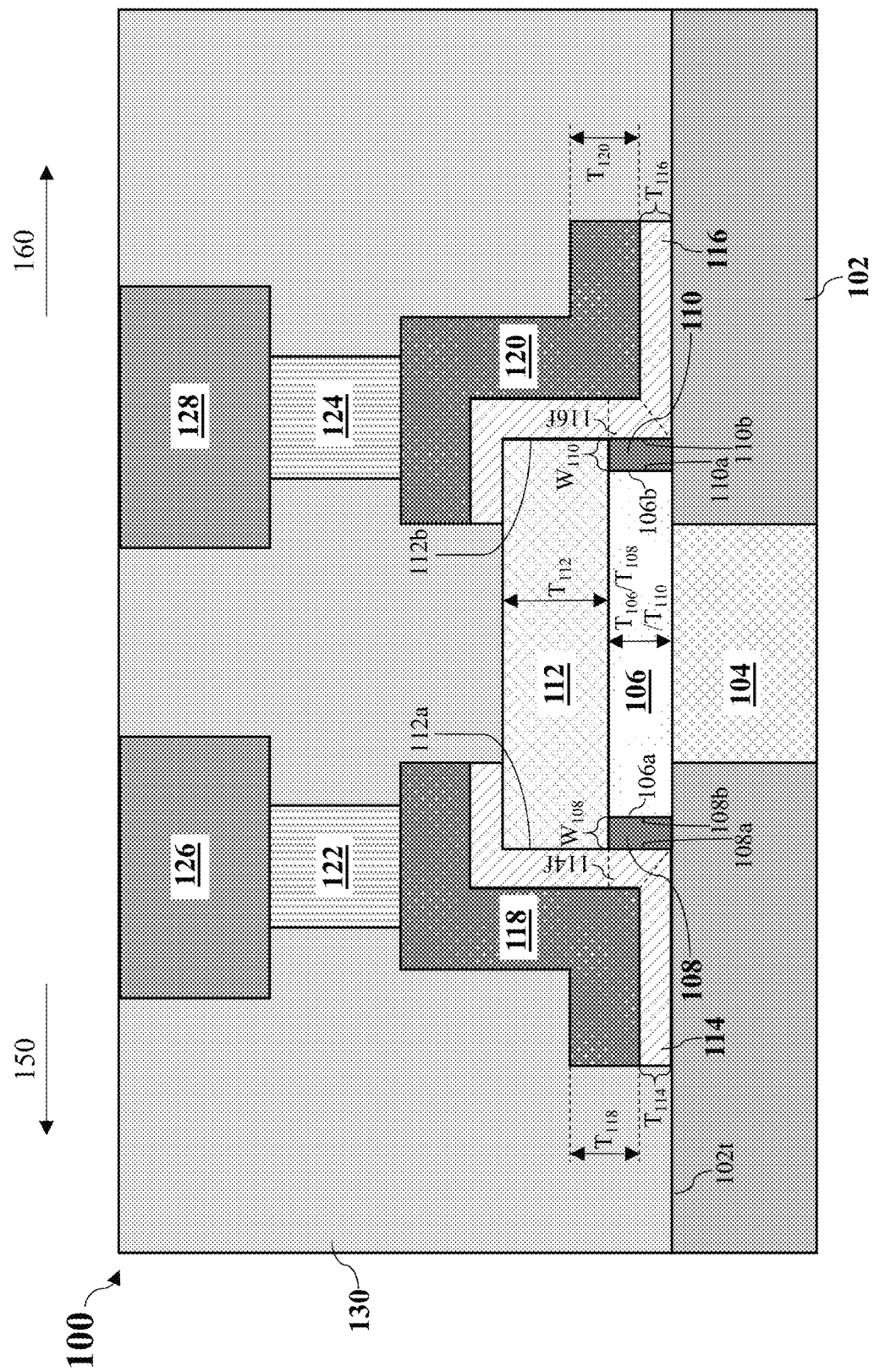
FIG. 1 shows a simplified cross-sectional view of a memory device according to various non-limiting embodiments.

The embodiments generally relate to semiconductor devices. More particularly, some embodiments relate to memory devices, for instance, non-volatile memory devices such as RRAM devices in a non-limiting example. The memory devices may be used in several applications, such as, but not limited to, neuromorphic computing applications and multi-bit applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a memory device 100 according to various non-limiting embodiments. The memory device 100 may be a RRAM device and may be a two-bit device.

As shown in FIG. 1, the memory device 100 may include a base insulating layer 102. The base insulating layer 102 may include insulating material such as, but not limited to, silicon oxide, silicon dioxide, silicon nitride, or combinations thereof. For example, the base insulating layer 102 may include an inter-layer dielectric (ILD) layer.

The memory device 100 may further include a conductive element 104 arranged within the base insulating layer 102. The conductive element 104 may include electrically conductive material, such as, but not limited to, metal (for example, aluminum, copper, tungsten, alloys thereof, or combinations thereof).

In addition, the memory device 100 may include a first electrode 106. The first electrode 106 may be referred to as a bottom electrode. The first electrode 106 may be cuboidal, and may include a first side surface 106a and a second side surface 106b. As shown in FIG. 1, the first side surface 106a may face a first direction 150 and the second side surface 106b may face a second direction 160 opposite to the first direction 150. In other words, the second side surface 106b may be opposite to the first side surface 106a. The first electrode 106 may include a first electrode material. For example, the first electrode 106 may include an active electrode material, such as, but not limited to, titanium (Ti), titanium nitride (TiN), tantalum (Ta), tantalum nitride (TaN), tungsten (W), aluminum (Al), alloys thereof or combinations thereof. A thickness $T_{106}$ of the first electrode 106 may be in the order of nanometers to tens of nanometers.

The memory device 100 may further include a first passivation layer 108 and a second passivation layer 110. The first passivation layer 108 may be arranged laterally alongside the first side surface 106a of the first electrode 106. The first passivation layer 108 may include a first surface 108a facing the first direction 150 and a second surface 108b facing the second direction 160. As shown in FIG. 1, the second surface 108b of the first passivation layer 108 may be arranged along the first side surface 106a of the first electrode 106. Similarly, the second passivation layer 110 may be arranged laterally alongside the second side surface 106b of the first electrode 106. The second passivation layer 110 may include a first surface 110a facing the first direction 150 and a second surface 110b opposite to the first surface 110a facing the second direction 160, where the first surface 110a of the second passivation layer 110 may be arranged along the second side surface 106b of the first electrode 106. Each passivation layer 108, 110 may include a passivation material. The passivation material of one or both passivation layers 108, 110 may be or include an oxide material, a nitride material, or combinations thereof, such as but not limited to titanium oxide (TiO), titanium nitride (TiN), titanium oxy-nitride (TiON), tantalum oxide (TaO), tantalum nitride (TaN), tantalum oxy-nitride (TaON), tungsten oxide (WO), tungsten nitride (WN), tungsten oxy-nitride (WON), aluminum oxide (AlO), aluminum nitride (AlN), aluminum oxy-nitride (AlON).

A width $W_{108}$, $W_{110}$ of each of the first and second passivation layers 108, 110 may be in the order of nanometers. For example, each width $W_{108}$, $W_{110}$ may range from about 2 nm to about 8 nm and in some non-limiting embodiments, may range from about 4.57 nm to about 6.85 nm. A thickness $T_{108}$, $T_{110}$ of each of the passivation layers 108, 110 may be substantially similar to the thickness $T_{106}$ of the first electrode 106, or alternatively, each of the passivation layers 108, 110 may be equal in thickness to the thickness $T_{106}$ of the first electrode 106.

The memory device 100 may also include an insulating element 112 arranged over the first electrode 106 and the passivation layers 108, 110. The insulating element 112 may be referred to as a hard mask element. The insulating element 112 may also be cuboidal, and may also include a first side surface 112a facing the first direction 150 and a second side surface $112_b$ opposite to the first side surface $112_a$ facing the second direction 160. The insulating element 112 may include an electrically insulating material, such as, but not limited to, tetraethyl orthosilicate (TEOS), silicon nitride (SiN), or combinations thereof. A thickness $T_{112}$ of the insulating element 112 may be in the order of tens of nanometers.

Further, the memory device 100 may include a first switching layer 114 and a second switching layer 116. As shown in FIG. 1, the first switching layer 114 may be arranged over the first electrode 106 and the first passivation layer 108; whereas, the second switching layer 116 may be arranged over the first electrode 106 and the second passivation layer 110. As shown in FIG. 1, the first and second switching layers 114, 116 may be arranged over the insulating element 112. The first switching layer 114 may be further arranged laterally alongside the insulating element 112 (e.g. along the first side surface 112a of the insulating element 112), laterally alongside the first passivation layer 108 (e.g. along the first surface 108a of the first passivation layer 108) and along a top surface 102t of the base insulating layer 102. Similarly, the second switching layer 116 may be further arranged laterally alongside the insulating element (e.g. along the second side surface 112b of the insulating element 112), laterally alongside the second passivation layer 110 (e.g. along the second surface 110b of the second passivation layer 110) and along the top surface 102t of the base insulating layer 102. Each of the first and second switching layers 114, 116 may include a switching material, such as, but not limited to, an oxide material, a nitride material, or combinations thereof. The oxide material may for example, include hafnium oxide (HfO), tantalum oxide (TaO), aluminum oxide (AlO), titanium oxide (TiO), tungsten oxide (WO), or combinations thereof. The nitride material may for example, include silicon nitride (SiN), boron nitride (BN), or combinations thereof. However, the switching material may include any other material known to those skilled in the art. Each of the first and second switching layers 114, 116 may have a substantially uniform thickness $T_{114}$, $T_{116}$. The thickness $T_{114}$, $T_{116}$ of each switching layer 114, 116 may be in the order of nanometers to tens of nanometers.

The passivation material of the passivation layers 108, 110 may depend on or be based on the switching material of the switching layers 114, 116 and/or the first electrode material of the first electrode 106.

For example, the passivation material may be selected such that a reactivity between the passivation material and the switching material may be lower than a reactivity between the first electrode material and the switching material. Accordingly, the passivation material may absorb less oxygen atoms from an oxide-based switching material or less nitrogen atoms from a nitride-based switching material. For example, the switching material may include an oxide material, and the passivation layers 108, 110 may each include an oxide material layer or an oxy-nitride material layer. Alternatively, the switching material may include a nitride material, and the passivation layers 108, 110 may each include a nitride material layer or an oxy-nitride material layer.

The passivation layers 108, 110 may each include an oxide material of the first electrode material, a nitride material of the first electrode material, or combinations thereof (e.g. an oxy-nitride material of the first electrode material). For example, the passivation layers 108, 110 may each include titanium oxide (TiO), titanium nitride (TiN), or titanium oxy-nitride (TiON) when the first electrode material includes a titanium (Ti) based material. For example, the passivation layers 108, 110 may each include titanium oxy-nitride (TiON) when the first electrode material includes a titanium nitride (TiN) based material. For example, the passivation layers 108, 110 may each include tantalum oxide (TaO), tantalum nitride (TaN) or tantalum oxy-nitride (TaON) when the first electrode material includes a tantalum (Ta) based material. For example, the passivation layers 108, 110 may each include tantalum oxy-nitride (TaON) when the first electrode material includes a tantalum nitride (TaN) based material. For example, the passivation layers 108, 110 may each include tungsten oxide (WO), tungsten nitride (WN) or tungsten oxy-nitride (WON) when the first electrode material includes a tungsten (W) based material. For example, the passivation layers 108, 110 may each include aluminum oxide (AlO), aluminum nitride (AlN) or aluminum oxy-nitride (AlON) when the first electrode material includes an aluminum (Al) based material. In some non-limiting embodiments, the passivation layers 108, 110 may each include a passivation material having an oxygen to nitrogen ratio, where the ratio of oxygen may range from about 2.16 to about 2.41, and the ratio of nitrogen may range from about 0.09 to about 0.23, for example when the passivation material of the passivation layers 108, 110 includes TiON.

However, in some alternative non-limiting embodiments, the passivation material of the passivation layers 108, 110 may be an oxide material, a nitride material or an oxy-nitride material of a material not included in the first electrode 106. For example, the first electrode material may include an aluminum based material, and the passivation material may be titanium oxide (TiO). Although the reactivity of such a passivation material with an oxide-based switching material may also be lower than that of the first electrode material with the switching material, the fabrication process of the memory device 100 may be more complex.

As shown in FIG. 1, the memory device 100 may further include a second electrode 118 and a third electrode 120. The second and third electrodes 118, 120 may be referred to as top electrodes. The second electrode 118 may be arranged along the first switching layer 114; whereas, the third electrode 120 may be arranged along the second switching layer 116. The second electrode 118 and the third electrode 120 may each include a second electrode material, for example, an active electrode material, such as, but not limited to, titanium (Ti), titanium nitride (TiN), tantalum (Ta), tantalum nitride (TaN), tungsten (W), aluminum (Al), alloys thereof, or combinations thereof. In some non-limiting embodiments, the first electrode 106, the second electrode 118 and the third electrode 120 may include a same material. However, the first electrode 106 may alternatively include a different material from the second and third electrodes 118, 120. The second and third electrodes 118, 120 may each have a substantially uniform thickness $T_{118}$, $T_{120}$. The thickness $T_{118}$, $T_{120}$ of each of the second and third electrodes 118, 120 may be in the order of nanometers to tens of nanometers.

The memory device 100 may further include a first connector 122, a second connector 124, a first conductive line 126, and a second conductive line 128. The first connector 122 may be connected to the first conductive line 126 and the second electrode 118; whereas, the second connector 124 may be connected to the second conductive line 128 and the third electrode 120. Accordingly, the first and second conductive lines 126, 128 may be electrically coupled to the second and third electrodes 118, 120, respectively. The first connector 122, the second connector 124, the first conductive line 126 and the second conductive line 128 may each include an electrically conductive material such as, but not limited to, metal (for example, aluminum, copper, tungsten, alloys thereof, or combinations thereof). For example, the first and second conductive lines 126, 128 may be metal lines; whereas, the first and second connectors 122, 124 may be conductive vias or interconnects.

The memory device 100 may include a further insulating layer 130 arranged over the base insulating layer 102. As shown in FIG. 1, the electrodes 106, 118, 120, the passivation layers 108, 110, the insulating element 112, the switching layers 114, 116, the connectors 122, 124 and the conductive lines 126, 128 may be arranged within the further insulating layer 130. The further insulating layer 130 may include an electrically insulating material, such as, but not limited to, silicon oxide, silicon dioxide, silicon nitride, or combinations thereof. For example, the further insulating layer 130 may include an inter-layer dielectric (ILD) layer. As shown in FIG. 1, the second and third electrodes 118, 120 may be laterally spaced apart from each other and the electrically insulating material (of the further insulating layer 130) may be arranged laterally between them.

As mentioned above, the memory device 100 may be a two-bit device. In use, a sufficiently large potential difference may be applied between the first electrode 106 and the second electrode 118 to form conductive filaments within a region 114f of the first switching layer 114. This may program the first bit of the memory device 100. Similarly, a sufficiently large potential difference may be applied between the first electrode 106 and the third electrode 120 to form conductive filaments within a region 116f of the second switching layer 116. This may program the second bit of the memory device 100. The regions 114f, 116f may be referred to as filament formation regions.

FIGS. 2A to 2G show simplified cross-sectional views illustrating a method for fabricating the memory device 100 according to various non-limiting embodiments. For clarity of illustration, some reference numerals are omitted from FIGS. 2A to 2G.

Referring to FIG. 2A, the method may include providing the base insulating layer 102 and forming the conductive element 104 within the base insulating layer 102. The conductive element 104 may be formed by etching the base insulating layer 102 to form an opening/trench and filling this opening/trench with electrically conductive material. The method may further include forming a layer 202 of first electrode material over the base insulating layer 102 and a layer 204 of insulating material over the layer 202.

Referring to FIG. 2B, the method may include forming an intermediate first electrode 206 from the layer 202 of first electrode material and forming the insulating element 112 from the layer 204 of insulating material. This may be done by etching the layers 202, 204 in a single etching process. Accordingly, the insulating element 112 may be formed over the intermediate first electrode 206, where at least a part of the insulating element 112 and at least a part of the intermediate first electrode 206 may be formed simultaneously. As shown in FIG. 2B, the intermediate first electrode 206 may include a first side surface 206a facing the first direction 150 and a second side surface 206b facing the second direction 160.

Figure 2C:
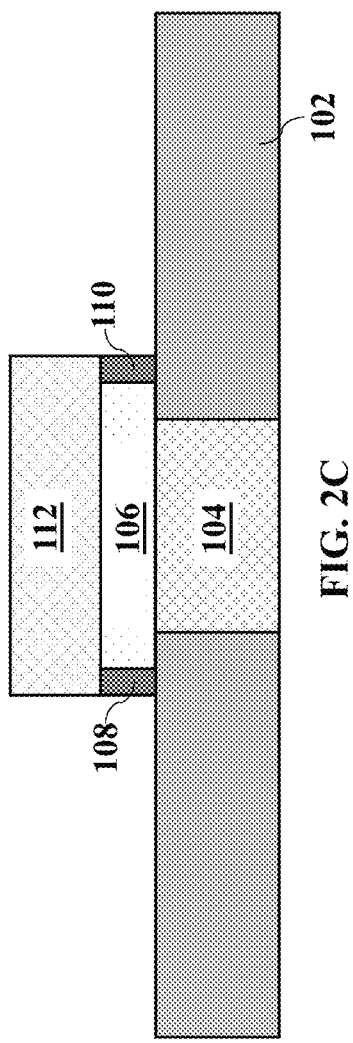

Referring to FIG. 2C, the method may include forming the first passivation layer 108, the second passivation layer 110 and the first electrode 106 therebetween. This may be done by applying a treatment to the first side surface 206a of the intermediate first electrode 206 (to form the first passivation layer 108) and applying a treatment to the second side surface 206b of the intermediate first electrode 206 (to form the second passivation layer 110). At least a part of the first passivation layer 108 and at least a part of the second passivation layer 110 may be formed simultaneously. The remaining portion of the intermediate first electrode 206 may form the first electrode 106. The treatment may be applied after the insulating element 112 is formed over the intermediate first electrode 206. Accordingly, the treatment may be applied with the insulating element 112 formed over the intermediate first electrode 206. The treatment may include a passivation process and may be referred to as a sidewall passivation of the intermediate first electrode 206. The treatment may include use of oxygen, ammonium, or combinations thereof. For example, the treatment may include an oxygen plasma treatment. By applying a treatment to each side surface 206a, 206b of the intermediate first electrode 206, the passivation layers 108, 110 may be formed by a self-aligned process without additional deposition and etching of material. However, any other process as known to those skilled in the art may be used to form the passivation layers 108, 110.

Figure 2D:
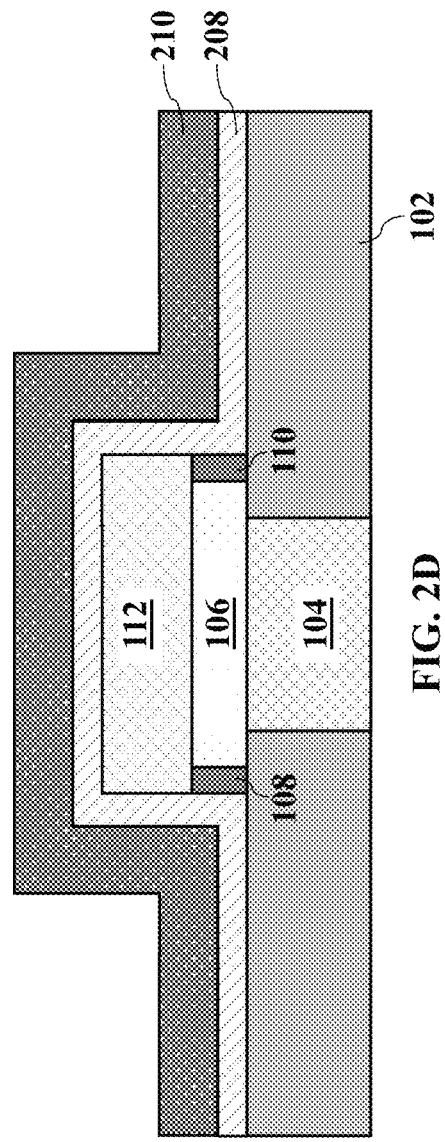

Referring to FIG. 2D, the method may further include forming a layer 208 of switching material over the base insulating layer 102 and the insulating element 112, and forming a layer 210 of second electrode material over the layer 208. The layers 208, 210 may be formed using any process as known to those skilled in the art. For example, the layer 208 of switching material may be formed by an atomic layer deposition (ALD) process.

Referring to FIG. 2E, the method may further include forming the switching layers 114, 116 from the layer 208 of switching material, and forming the second electrode 118 and the third electrode 120 from the layer 210 of second electrode material. This may be done by for example, etching the layers 208, 210 in a single etching process and smoothing a top surface of the layer 210 using, for example, a chemical mechanical polishing (CMP) process.

Referring to FIG. 2F, the method may further include forming a first layer 212a of insulating material over the base insulating layer 102, such that the electrodes 106, 118, 120, the switching layers 114, 116, the insulating element 112 and the passivation layers 108, 110 may be arranged within the layer 212a.

Figure 2G:
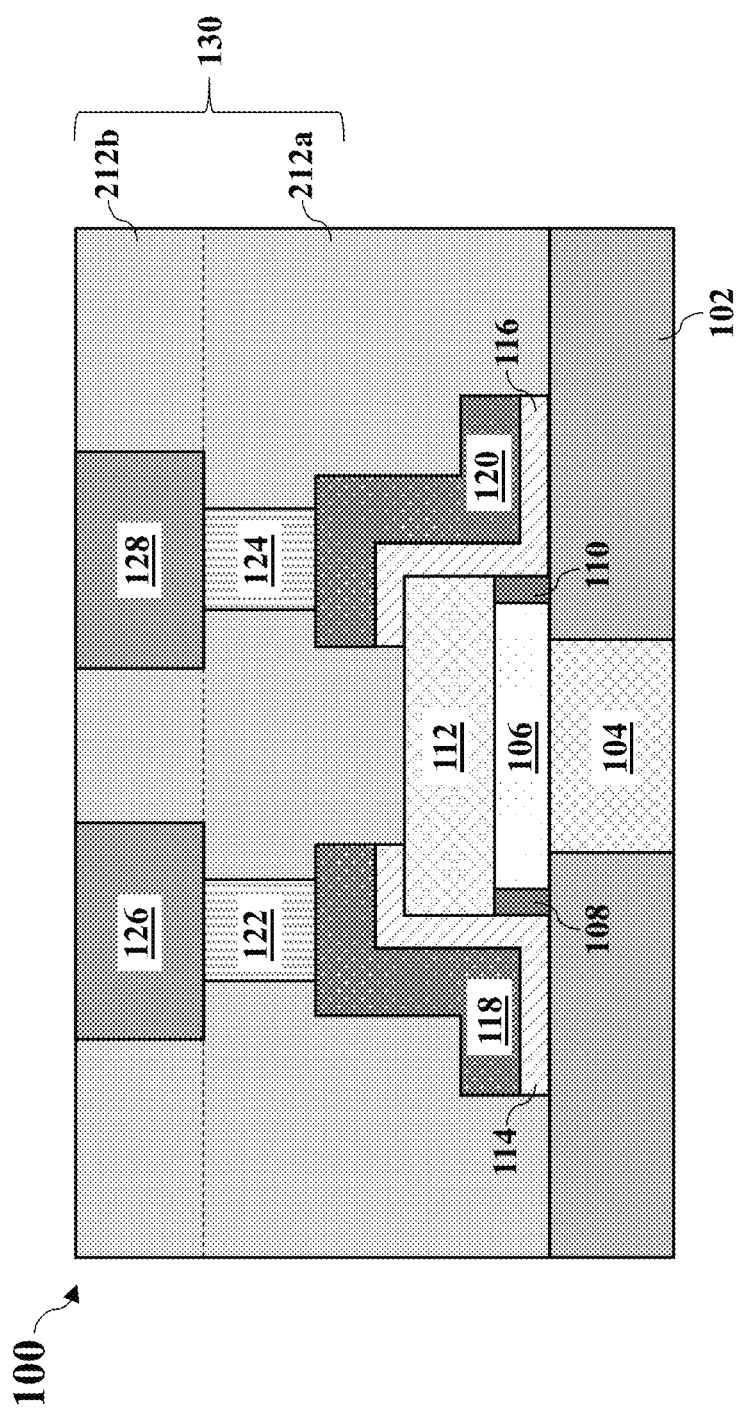

Referring to FIG. 2G, the method may include forming the first and second connectors 122, 124 and the first and second conductive lines 126, 128. This may be done by etching the first layer 212a of insulating material to form openings/trenches and filling these openings/trenches with an electrically conductive material to form the connectors 122, 124. A second layer 212b of insulating material may then be formed over the first layer 212a of insulating material. This second layer 212b may be etched to form openings/trenches and the openings/trenches may be filled with an electrically conductive material to form the conductive lines 126, 128. The remaining portions of the first layer 212a and the second layer 212b may form the further insulating layer 130.

The above described order for the method is only intended to be illustrative, and the method is not limited to the above specifically described order unless otherwise specifically stated. Further, as mentioned above, any other process as known to those skilled in the art may be used to form the passivation layers 108, 110. For example, the passivation layers 108, 110 may be formed by depositing passivation material over the intermediate first electrode 206 and etching the passivation material. In such non-limiting embodiments, the passivation material may include an oxide material, a nitride material or an oxy-nitride material of a material not in the first electrode material (e.g. the first electrode material may include an aluminum (Al) based material and the passivation material may be titanium oxide (TiO)). However, the fabrication of such a memory device 100 may be more complex due to the deposition and etching processes.

Figure 3:
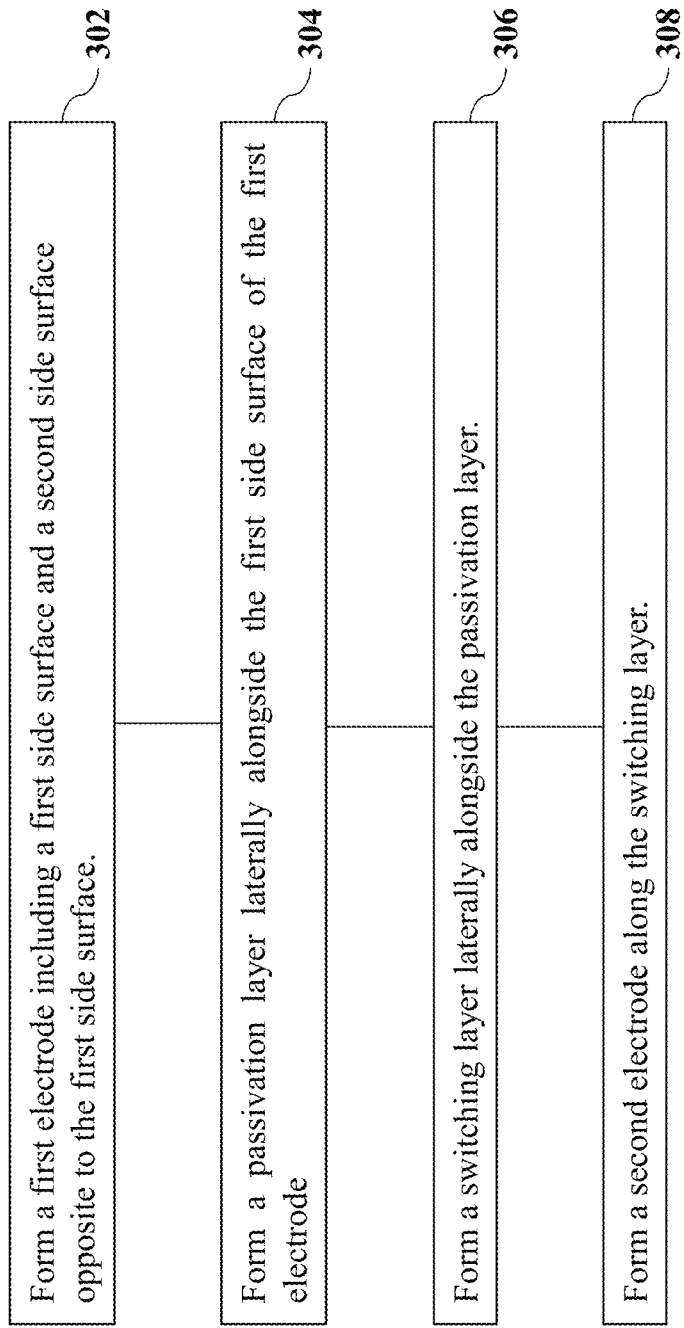
FIG. 3 shows a flow diagram of a method for fabricating a memory device according to various non-limiting embodiments.

FIG. 3 shows a flow diagram of a method for fabricating a memory device according to various non-limiting embodiments.

At 302, the method may include forming a first electrode including a first side surface and a second side surface opposite to the first side surface. The first electrode may for example, be the first electrode 106 described above and 302 may include the processes described with reference to FIGS. 2A to 2C.

At 304, the method may include forming a passivation layer laterally alongside the first side surface of the first electrode. The passivation layer may for example, be the first passivation layer 108 described above and 304 may include the process described with reference to FIG. 2C.

At 306, the method may include forming a switching layer laterally alongside the passivation layer. The switching layer may for example, be the first switching layer 114 described above and 306 may include the processes described with reference to FIGS. 2D and 2E.

At 308, the method may include forming a second electrode along the switching layer. The second electrode may for example, be the second electrode 118 and 308 may include the processes described with reference to FIGS. 2D and 2E.

Due to the presence of the passivation layers 108, 110, the first electrode 106 may not contact (and thus, may not react with) the switching material during the formation of the switching layers 114, 116. Hence, the first electrode 106 may be formed of active electrode material that may be less costly. Further, as described above, the passivation layers 108, 110 may each include a passivation material that may react less with the switching material during the fabrication of the RRAM device 100. Accordingly, fewer defects may be formed at the interfaces between the passivation layers 108, 110 and the respective switching layers 114, 116. This may help to improve the switching uniformity of the RRAM device 100. In other words, there may be less variation in the resistance of the RRAM device 100 over different switching cycles. In addition, by arranging the first electrode 106 over the substrate 102 and laterally between the switching layers 114, 116, an area of each of the filament formation regions 114f, 116f may be reduced by reducing the thickness $T_{106}$ of the first electrode 106. Greater filament confinement may thus be achieved and the variation in the resistance of the RRAM device 100 over different switching cycles may be further reduced.

The width $W_{108}$, $W_{110}$ and elements ratio (for example, the oxygen to nitrogen ratio) of each passivation layer 108, 110 may be adjusted by varying the length of time the treatment is applied to each side surface 206a, 206b of the intermediate first electrode 206. Applying the treatment to each side surface 206a, 206b over a longer duration may increase the width $W_{108}$, $W_{110}$ of each passivation layer 108, 110. This may help to provide greater separation between the first electrode 106 and the switching material during the fabrication of the RRAM device 100, and in turn, may help to further reduce the variation in the resistance of the RRAM device 100 over different switching cycles. Applying the treatment to each side surface 206a, 206b over a longer duration may also increase the oxygen to nitrogen ratio of each passivation layer 108, 110, and this can reduce the reactivity between the passivation material and the switching material. In turn, fewer defects may be present at the interfaces between the passivation layers 108, 110 and the switching layers 114, 116, and the variation in the resistance of the RRAM device 100 over different switching cycles may be further reduced.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A memory device comprising:
a first electrode comprising a first side surface and a second side surface opposite to the first side surface;
a passivation layer arranged laterally alongside the first side surface of the first electrode;
a switching layer arranged laterally alongside the passivation layer;
a second electrode arranged along the switching layer; and
an insulating element arranged over the first electrode and the passivation layer; wherein the switching layer is arranged over the insulating element.

2. The memory device of claim 1, wherein the switching layer is further arranged over the first electrode and the passivation layer.

3. The memory device of claim 1, wherein the switching layer is further arranged laterally alongside the insulating element.

4. The memory device of claim 1, wherein the switching layer comprises a switching material, the first electrode comprises a first electrode material, and the passivation layer comprises a passivation material;
wherein a reactivity between the passivation material and the switching material is lower than a reactivity between the first electrode material and the switching material.

5. The memory device of claim 4, wherein the switching material comprises an oxide material, and wherein the passivation layer comprises an oxide material layer.

6. The memory device of claim 4, wherein the switching material comprises a nitride material, and wherein the passivation layer comprises a nitride material layer.

7. The memory device of claim 1, wherein the first electrode comprises a first electrode material and the passivation layer comprises an oxide material of the first electrode material, a nitride material of the first electrode material, or combinations thereof.

8. The memory device of claim 1, wherein the first electrode and the second electrode comprise a same material.

9. The memory device of claim 1, wherein the first electrode comprises an active electrode material.

10. The memory device of claim 1, wherein the passivation layer is a first passivation layer and the memory device further comprises a second passivation layer arranged laterally alongside the second side surface of the first electrode.

11. The memory device of claim 10, wherein the switching layer is a first switching layer and the memory device further comprises:
a second switching layer arranged laterally alongside the second passivation layer.

12. The memory device of claim 11, further comprising a third electrode arranged along the second switching layer.

13. The memory device of claim 1, wherein the memory device comprises a resistive random access memory (RRAM) device.

14. A method for fabricating a memory device, the method comprising:
forming a first electrode comprising a first side surface and a second side surface opposite to the first side surface;
forming a passivation layer laterally alongside the first side surface of the first electrode;
forming an insulating element over the first electrode and the passivation layer;
forming a switching layer laterally alongside the passivation layer and over the insulating element; and
forming a second electrode along the switching layer.

15. The method of claim 14, wherein forming the first electrode and the passivation layer comprises:

forming a layer of first electrode material;
forming an intermediate first electrode from the layer of first electrode material;
applying a treatment to a first side surface of the intermediate first electrode to form the passivation layer and the first electrode.

16. The method of claim 15, wherein the treatment comprises use of oxygen or ammonium.

17. The method of claim 15, wherein forming the insulating element over the first electrode and the passivation layer comprises forming a layer of insulating material over the layer of first electrode material, and forming the insulating element from the layer of insulating material over the intermediate first electrode; and
wherein the treatment is applied with the insulating element formed over the intermediate first electrode.

18. The method of claim 15, wherein the passivation layer is a first passivation layer, wherein the method further comprises applying a treatment to a second side surface of the intermediate first electrode to form a second passivation layer laterally alongside the second side surface of the first electrode.

19. The method of claim 18, wherein at least a part of the first passivation layer and at least a part of the second passivation layer are formed simultaneously.

20. The memory device of claim 1, further comprising:
a base insulating layer including a conductive element within the base insulating layer, the first electrode overlapping the base insulating layer and the conductive element, and the passivation layer overlapping the base insulating layer; and
a first connector and a first conductive line, wherein the first connector is connected to the first conductive line and the second electrode.

* * * * *